(12) United States Patent
Hughes

(10) Patent No.: US 8,962,462 B1
(45) Date of Patent: Feb. 24, 2015

(54) OVERVOLTAGE TOLERANT HFETS

(71) Applicant: HRL Laboratories, LLC, Malibu, CA (US)

(72) Inventor: Brian Hughes, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/964,918

(22) Filed: Aug. 12, 2013

Related U.S. Application Data

(62) Division of application No. 12/912,065, filed on Oct. 26, 2010, now Pat. No. 8,592,865.

(60) Provisional application No. 61/256,139, filed on Oct. 29, 2009.

(51) Int. Cl.
*H01L 21/28* (2006.01)
*H01L 21/44* (2006.01)
*H01L 29/66* (2006.01)
*H01L 29/80* (2006.01)

(52) U.S. Cl.
CPC ........ *H01L 29/66431* (2013.01); *H01L 29/802* (2013.01)

USPC .......... 438/572; 438/140; 438/285; 257/192; 257/282

(58) Field of Classification Search
USPC ......... 438/167, 178, 317, 235, 312, 197, 140, 438/285, 778, 787, 454, 572, 570; 257/213, 257/134, 288, 133, 189, 76, 194, 78, 183, 257/902, 12, 256, 280, 282, 192
See application file for complete search history.

(56) References Cited

U.S. PATENT DOCUMENTS

| 6,150,680 A * | 11/2000 | Eastman et al. ............. 257/224 |
| 8,318,562 B2 * | 11/2012 | Khan et al. .................. 438/285 |
| 8,592,865 B1 * | 11/2013 | Hughes ......................... 257/192 |

* cited by examiner

*Primary Examiner* — Thanh Y Tran
(74) *Attorney, Agent, or Firm* — George R. Rapacki

(57) ABSTRACT

Design constraints for a self protecting GaN HFET and in general any group III V HFET are described. The design constraints depend on the separation between the gate and the drain and the thickness of the buffer material between the channel layer and the substrate. In one embodiment the buffer region is thinned to provide a preferred breakdown location.

13 Claims, 7 Drawing Sheets

OVERVOLTAGE TOLERANT HFETS

This application is a divisional application of, and claims priority to, Ser. No. 12/912,065 filed 26 Oct., 2010 titled "Overvoltage Tolerant HFETs."

This application claims priority to provisional application 61/256,139 filed Oct. 29, 2009 titled Dimensions and Characteristics for Overvoltage Tolerant HFETs.

FIELD OF THE INVENTION

The present invention relates to the area of fabrication of Gallium Nitride Heterogeneous Field Effect Transistors with components sized and located to ensure voltage breakdown occurs through the III-Nitride buffer to a silicon substrate rather than along the AlGaN barrier layer between the gate and drain or source.

BACKGROUND OF THE INVENTION

A III-Nitride heterojunction transistor built on a silicon substrate has at least two failure modes where an excess voltage applied between the drain and the gate can cause an avalanche effect. The first mode is usually fatal to the device and that occurs when the conductive path is along the AlGaN Barrier layer. The second failure mode is more tolerable and is from the GaN channel through the III-Nitride Buffer to a substrate.

III-Nitride Heterojunction field effect transistors normally breakdown in the interface between the barrier layer and the insulation or passivation layer between the gate and the drain, and usually results in the destruction of the transistor. This problem is partially solved by restricting the operating range of the transistor, including transients, to stay within the breakdown limit. Alternatively, the transistor may be designed to allow safe breakdown of the transistor. Other partial solutions include purposely selecting the passivation or insulation layer or adding field plates to reduce the electric field between the source and drain and increasing the breakdown limit.

Typical III-Nitride Heterojunction field effect transistors have been fabricated on insulating substrates such as SiC, or sapphire, which are not suitable for conducting the breakdown current, especially at high speed. Typically, the voltage drop across a silicon substrate is small compared to the breakdown voltage for both conductive and high-resistance silicon substrates. For the more difficult high-resistance silicon substrate case, the estimated voltage drop is less than 20 V across a 6000 ohm-cm, 600 mm thick silicon substrate with a breakdown current of 10 microA/mm of gate width.

Prior art emphasis has been to prevent breakdown though the buffer layer in order to increase the transistor breakdown voltage. The structures were designed for preventing buffer breakdown in the transistor. For example, a GaN on silicon design for Nitronex RF transistors has a thin buffer ~1.5 micrometer that breaks down at 450V. The breakdown at the surface for this device is less than 200V. Consequently an overvoltage causes a breakdown at the surface which destroys the device. Prior art design emphasis has been to increase the buffer thickness and material quality to increase the buffer breakdown voltage. One technique in the prior art has used separate devices such as Zener diodes to protect transistors or circuit.

Other researchers have reported the linear increase in substrate breakdown voltage with buffer layer thickness. Furukawa [N. Ikeda et. al, "High Power GaN HFETs on Silicon Substrate,", Furukawa Review, No. 34, p. 17-23, 2008] reported buffer breakdown voltage up to 1700 V with a slope of 326 V/micrometer. The substrate breakdown versus buffer thickness characteristic may be measured experimentally for each buffer design. The breakdown characteristic will depend on buffer parameters including III-Nitride composition and design (e.g., super lattice), buffer quality (e.g., growth temperature, and stoichiometry), and doping or trap concentration (e.g., carbon concentration).

There are prior disclosures affecting breakdown voltages in III-Nitride Heterojunction transistors, such as growing III-Nitride on conductive substrates to reduce field strengths in the gate region, including silicon substrates [e.g., U.S. Pat. No. 7,538,366 issued May 26, 2009]. There are prior disclosures adding a III-Nitride buffer layer under III-Nitride Heterojunction transistors, some for isolation [U.S. Pat. No. 6,534,801 issued Mar. 18, 2003]. There is a prior disclosure connecting a p-type GaN buffer layer beneath an HFET to reduce surface fields (RESURF) which improves gate-drain breakdown voltage [U.S. Pat. No. 6,100,549 issued Aug. 8, 2000] but without addressing breakdown to the substrate. In general, prior art designs a buffer layer to prevent voltage breakdown through the buffer layer [U.S. patent application Ser. No. 11/103,127, PatApp Publication 20060226413] rather than take advantage of it.

SUMMARY OF THE INVENTION

In one aspect of the invention, a method of fabricating an overvoltage tolerant HFET device, the method comprising: receiving an HFET device comprising a barrier layer disposed on a channel layer, the channel layer disposed on a buffer layer, the buffer layer disposed on a substrate; the HFET device having a surface breakdown field strength Es and a buffer breakdown field strength Ebar; wherein the buffer layer has a first thickness; disposing a source structure and a gate structure on the barrier layer; disposing a drain structure on the barrier layer a first distance from the gate structure; wherein the first distance multiplied by Es is greater than the first thickness multiplied by Ebar.

In another embodiment of the invention the barrier layer substantially comprises AlGaN, the channel layer substantially comprises GaN; and the buffer layer substantially comprises GaN. The substrate may substantially comprise silicon although other conductive substrate materials know to those of ordinary skill in the art may be used. In addition, the method may connect the substrate to a ground.

In another embodiment of the invention, the method further comprising exposing a portion of the buffer layer beyond a boundary of the source, drain and gate; then thinning the exposed buffer layer to a second thickness less than the first thickness; metalizing the thinned region of the buffer layer; and electrically connecting the thinned region of the buffer layer to the drain. The thinning of the buffer layer may be accomplished by etching.

In one aspect of the invention an HFET device comprising a source, a drain and a gate contacts defined within a boundary, a GaN channel layer and an AlGaN barrier layer between the GaN channel layer and the source, drain and gate contacts, a buffer layer disposed between the channel layer and a substrate with a portion exposed beyond the boundary, the buffer layer beyond the boundary thinned to a first thickness and electrically connected to the drain. In addition, the previous embodiment wherein the separation between the gate and the drain may be between 1 micrometers and 20 micrometers and the first thickness may be between 1.0 micrometer and 8 micrometers.

In one aspect of the invention another embodiment of an HFET device comprising source, drain and gate contacts disposed within a boundary on a AlGaN barrier layer, the barrier layer disposed on an GaN channel layer, the channel layer disposed on a substantially GaN buffer layer with a breakdown filed strength Ebar and the buffer layer disposed on a substantially conductive substrate, the gate and drain contacts separated by first distance and with a surface breakdown field strength Es, a first portion of the buffer layer beyond the boundary of the source, gate and drain contacts with a first thickness, the first thickness of the buffer layer multiplied by Ebar is greater than the first distance multiplied by Es.

In another aspect of the invention, the previous embodiment wherein Es may be between 60 and 100 v/micrometer, Ebar may be between 200 and 350 V/micrometer, the first distance may be between 1.0 micrometers and 20 micrometers and the first thickness may be between 1.0 micrometer and 8.0 micrometers. In addition, the previous embodiment may further comprise an electrical connection between the drain and the first portion of the buffer layer.

BRIEF DESCRIPTION OF THE DRAWINGS

The accompanying drawings, together with the specification, illustrate exemplary embodiments of the present invention, and, together with the description, serve to explain the principles of the present invention.

The following paper is incorporated by reference as though fully set forth herein: High-Power GaN HFETs on Silicon Substrate, N. Ikeda et. al. Furakawa Review, No 34, p 17-23, 2008

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

The problem of preventing an overvoltage from damaging or destroying the transistor through breakdown, between the gate and drain, of the interface between or along the barrier layer and the insulator or passivation layer is solved by designing the III-Nitride buffer layer to have a lower breakdown voltage than the breakdown voltage from the drain to the gate through the barrier layer.

The present invention is a III-Nitride hetero junction field-effect transistor built on a silicon substrate. In some embodiments the substrate is conductive or semi-conductive. The III-Nitride buffer layer between the silicon substrate and, for example, the channel layer of the device, is designed for a breakdown voltage less than the breakdown voltage of the transistor from gate to drain.

Figure 1:
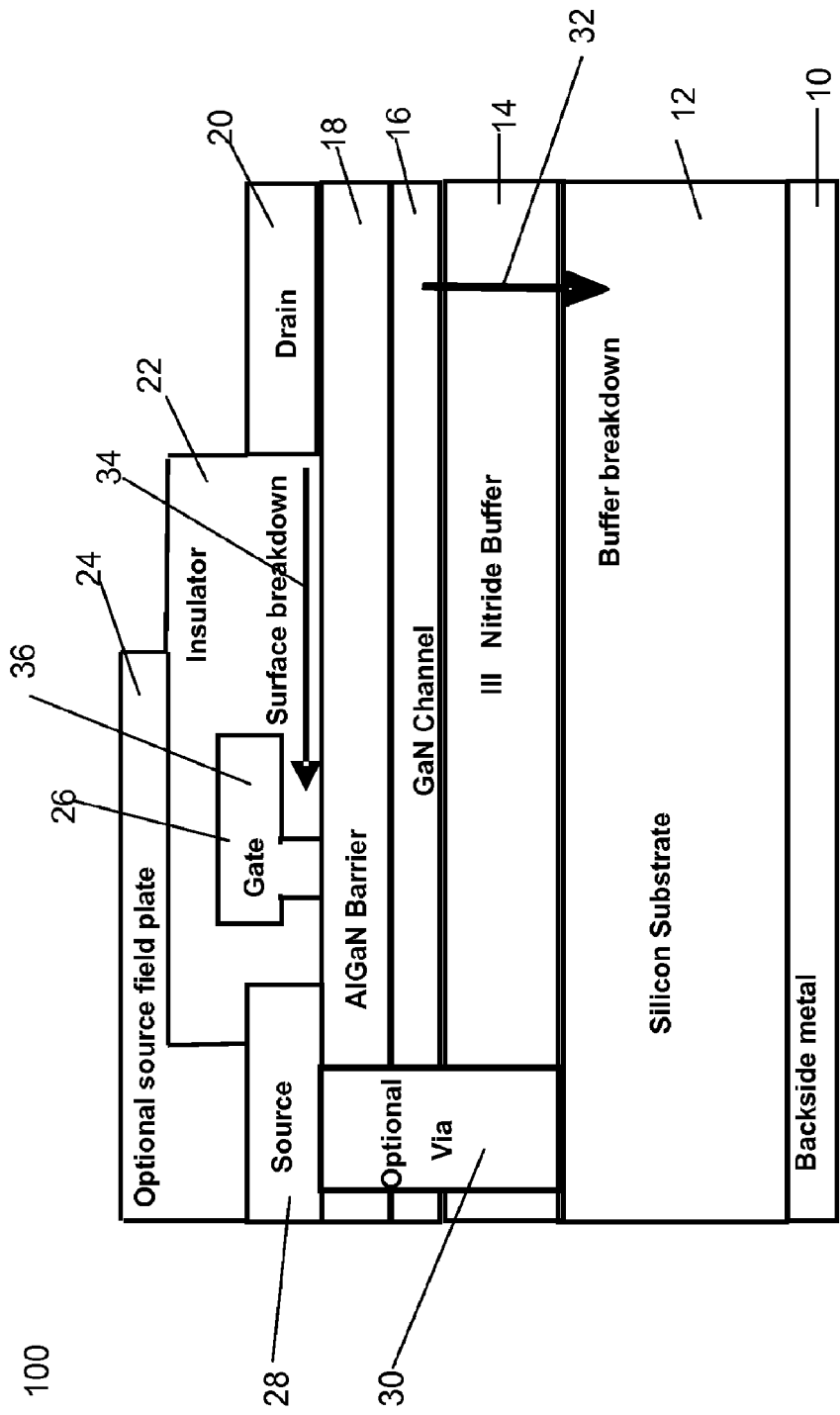
FIG. 1: III-Nitride heterojunction transistor on silicon substrate showing the two potential breakdown paths.

Not all breakdowns damage or destroy the transistor. An overvoltage breakdown in the transistor between the gate and the drain through the barrier layer or on the surface can damage the transistor. Breakdown through the insulating buffer layer between the drain and the silicon substrate can be repeated without damage, within limits. FIG. 1 shows the preferred embodiment with a AlGaN/GaN HFET with a GaN buffer 14 on a silicon substrate. The substrate may be conductive or semi-conductive in that it will conduct some current. The substrate may be embodied in silicon or other material able to conduct a current. FIG. 1 illustrates the two potential breakdown paths.

In FIG. 1 the substrate 12 may be suitably doped silicon and may be fabricated on a metal backside 10. The insulating buffer 14, sized for a specific breakdown voltage, is fabricated on the silicon substrate 12 of a III Nitride material. In one embodiment of the invention, the buffer 14 comprises substantially GaN. The remaining transistor elements include the channel layer 16 and the barrier layer 18. These layers may be fabricated with GaN and AlGaN respectively. The remaining transistor components are the drain 20, gate 26, source 28 an insulator 22. The transistor includes optional source field plate 24, an optional gate field plate 36, and an optional via 30 connecting the source 28 to the silicon substrate 12.

The overvoltage breakdown path 34 from the gate to the drain is the one that results in damage to the device. The alternate overvoltage breakdown path 32 is through the barrier 18, channel 16 and buffer 14 layers. This alternate overvoltage breakdown path 32 does not automatically result in damage to the transistor, although repeated breakdowns in the same region can cumulatively result in damage to the transistor.

Figure 6:
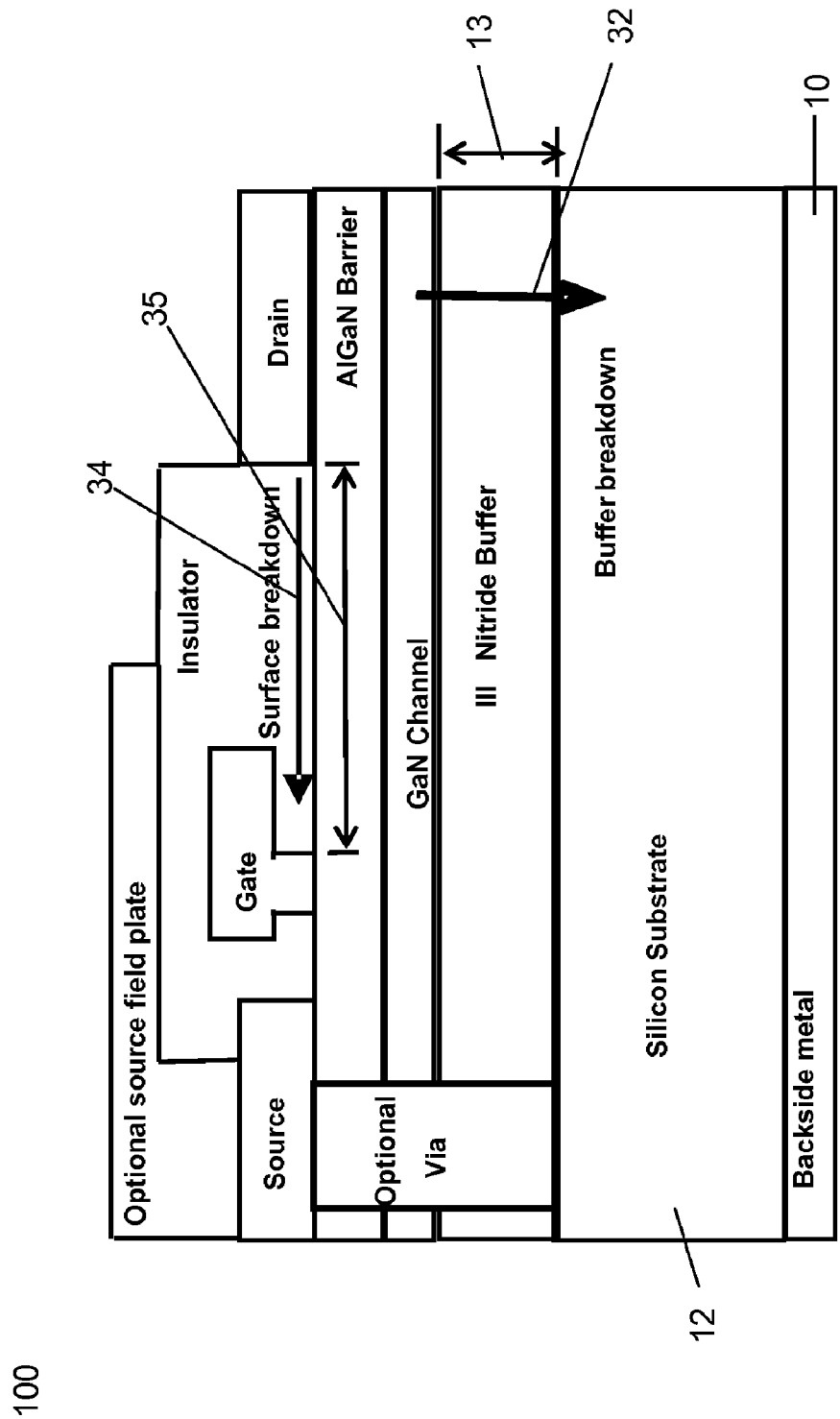
FIG. 6: III-Nitride heterojunction transistor on silicon substrate showing dimensions critical to the breakdown paths.

FIG. 6 shows the critical buffer 14 thickness for the device in FIG. 1. The buffer layer 14 has a thickness 13 while the drain to gate breakdown is determined by the distance 35 between the drain and gate.

The transistor surface breakdown voltage, BVs, increases with: gate-drain spacing 35, Lgd, for a given gate field plate structure, III-Nitride epitaxial structure, and passivation. The typical effective surface breakdown field for GaN HFET power transistors, Es, is about 60 to 100 V/micrometer. The effective surface breakdown field Es should be proportional to the critical breakdown field of III-Nitride barrier material, Ebar, but a factor of approximately 2× lower (2Es<=Ebar). Experimentally, the dependence of BVs has a non-zero intercept, BVos. The surface breakdown voltage is BVs=Es*Lgd+BVos The buffer 14 breakdown voltage, BVb, increases with buffer thickness 13, tb, for a given buffer material. The typical effective buffer breakdown field for GaN HFET power transistors, Eb, is about 200 to 350 V/micrometer. This range is similar to the critical breakdown field of III-Nitride material. Experimentally, the dependence of BVb has a non-zero intercept, BVbs. The buffer breakdown voltage is BVb=Eb*tb+BVbs.

By designing the III-Nitride transistors for breakdown in the buffer 14 before the surface breakdown in the transistor 100, that is BVs is greater than BVb, the transistor 100 itself can be made resilient to overvoltage. Note the thickness of the Barrier layer 18 or the conductive channel 16 can not be varied for a desired breakdown voltage because the dimensions of these components are set to achieve particular performance criteria. The substrate 12 potential must allow breakdown in the buffer 14 first. Using a silicon substrate 12 below the transistor 100 and buffer layer 14 further increases the tolerance of the transistor 100 to overvoltages. Typically and without implying a limitation, the drain 20 is at a high positive potential. One preferred embodiment grounds the buffer 14. Alternatively, the substrate 12 can be set at the source 28 potential by connecting the source 28 to the silicon substrate 12 with a conductive via 30, as shown in FIG. 1.

One preferred embodiment of a transistor designed for a breakdown of 900 V, an Eb, of 240 V/micrometer has a buffer thickness 13 of 3.8 micrometers. For an Es of 85 V/micrometers, the gate-drain spacing must be greater than 10.6 micrometers.

In this preferred embodiment, a gate-drain spacing Lgd of 12 micrometers will result in an average surface breakdown voltage, BVs, of 1020 V. Furthermore, the surface breakdown voltage must be designed to exceed buffer breakdown over manufacturing process variation and over device operating temperature.

Devices with 0.2 mm gate width and 20 mm gate width were fabricated and tested. III-Nitride HFET devices with 20 mm gate width and fabricated on high resistivity silicon substrates demonstrated (1) useful switch performance, (2) controlling surface breakdown voltage with gate-drain spacing, and (3) stable repeated breakdown through the silicon substrate.

Figure 2:
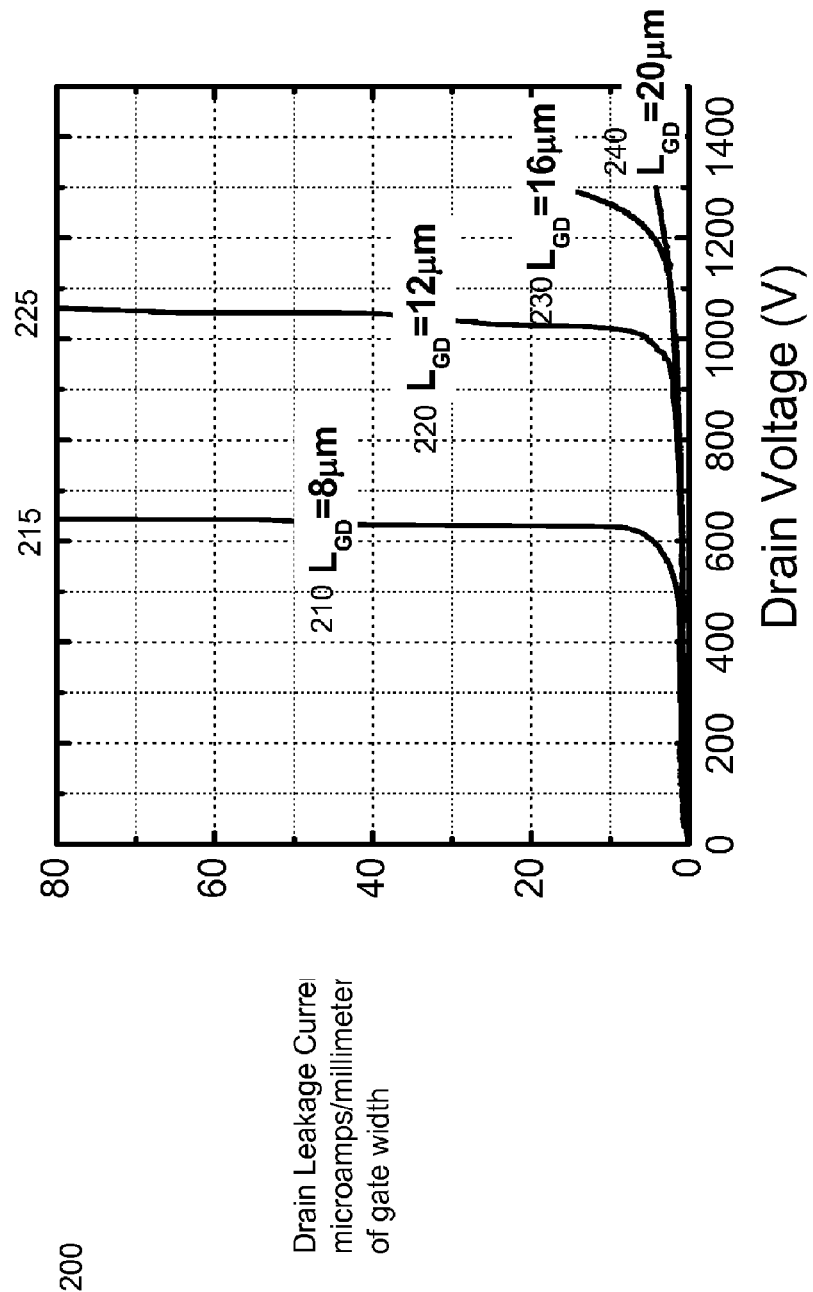
FIG. 2: III-Nitride heterojunction transistor on conductive substrate. Plot of measured drain leakage current (normalized to gate width) versus drain voltage, for 0.2 mm gate width III-Nitride HFETs. The plot demonstrates the increases of breakdown voltage with the increase of gate-drain spacing, Lgd.

FIG. 2 shows the leakage current (normalized to the 0.2 millimeter gate width) versus drain voltage for 0.2 mm gate-width HFETs with a range of gate-drain spacings. The measurements were made on-wafer with the substrate floating to prevent buffer breakdown. With the substrate floating the gate to source voltage was set to −2v to ensure the device was biased off. As the gate-drain spacing 210 increases from 8 micrometers to 12 micrometers 220, the breakdown voltage BVs increases from 630 volts (215) to 1060 volts (225). FIG. 2 demonstrates the increase in surface breakdown voltage BVs with gate-drain spacing. Catastrophic failure of these transistors was observed during surface breakdown testing, even when limiting gate and drain currents.

Figure 3:
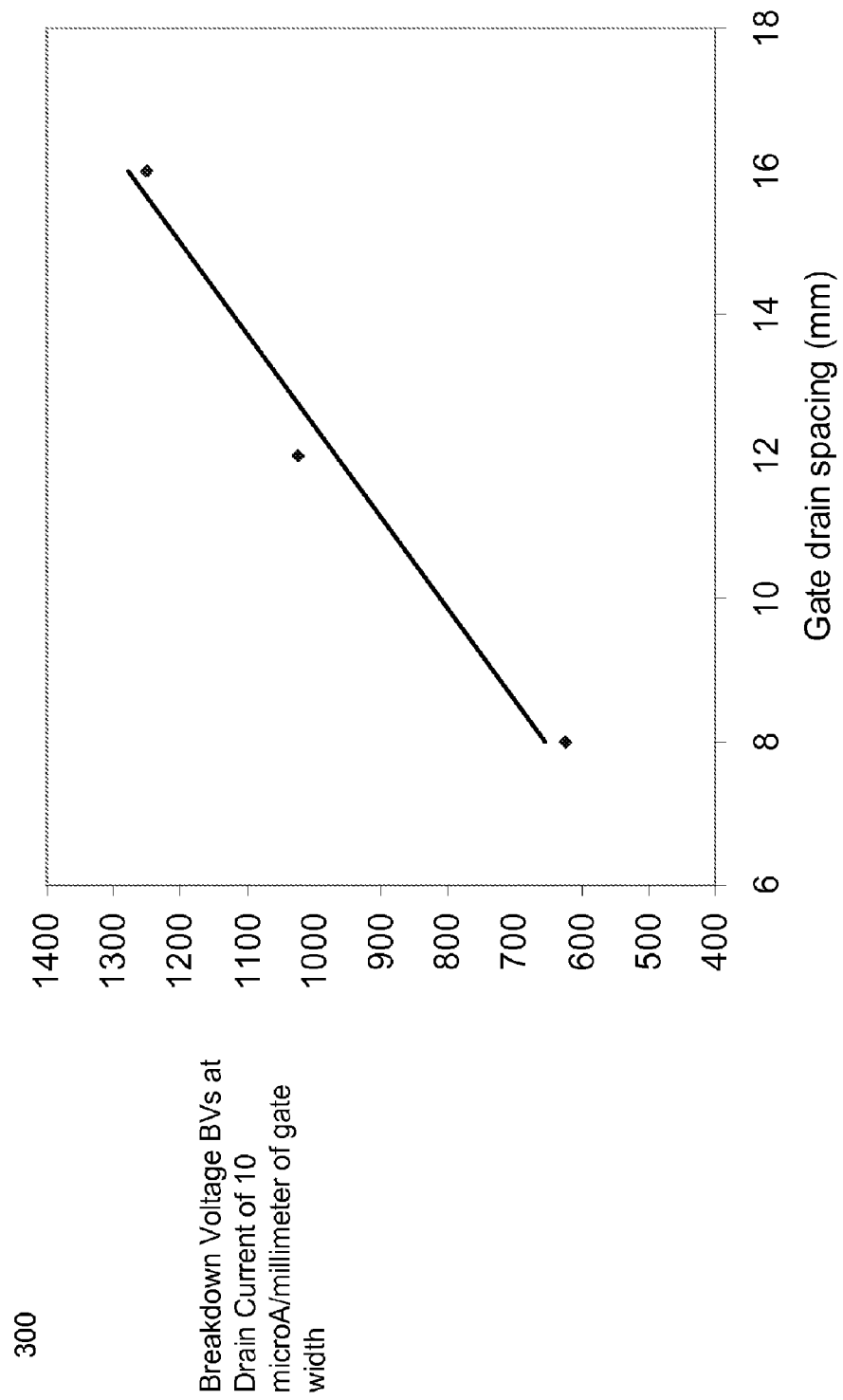
FIG. 3: III-Nitride heterojunction transistor on conductive substrate. Plot of surface breakdown voltage at drain leakage current normalized to gate width of 10 microA/mm versus gate to drain spacing. The plots demonstrate control of the surface breakdown voltage with HFET gate-drain spacing, Lgd.

FIG. 3 shows the linear increase of surface breakdown voltage BVs with increase of gate-drain spacing for the same design as in FIG. 2. FIG. 3 demonstrates the interrelationship between the surface breakdown voltage and HFET geometry. The slope and intercept of the line in FIG. 3 will depend on many device parameters, including gate length, lengths and heights of the optional gate and source field-plates 36 and 24 respectively in FIG. 1, III-Nitride epi design, and passivation. The breakdown voltage of the 0.2 mm HFET with a floating substrate was 1060V. When the substrate was grounded, the breakdown voltage decreased to about 900 V and the majority of drain leakage current was measured through the substrate.

Figure 4:
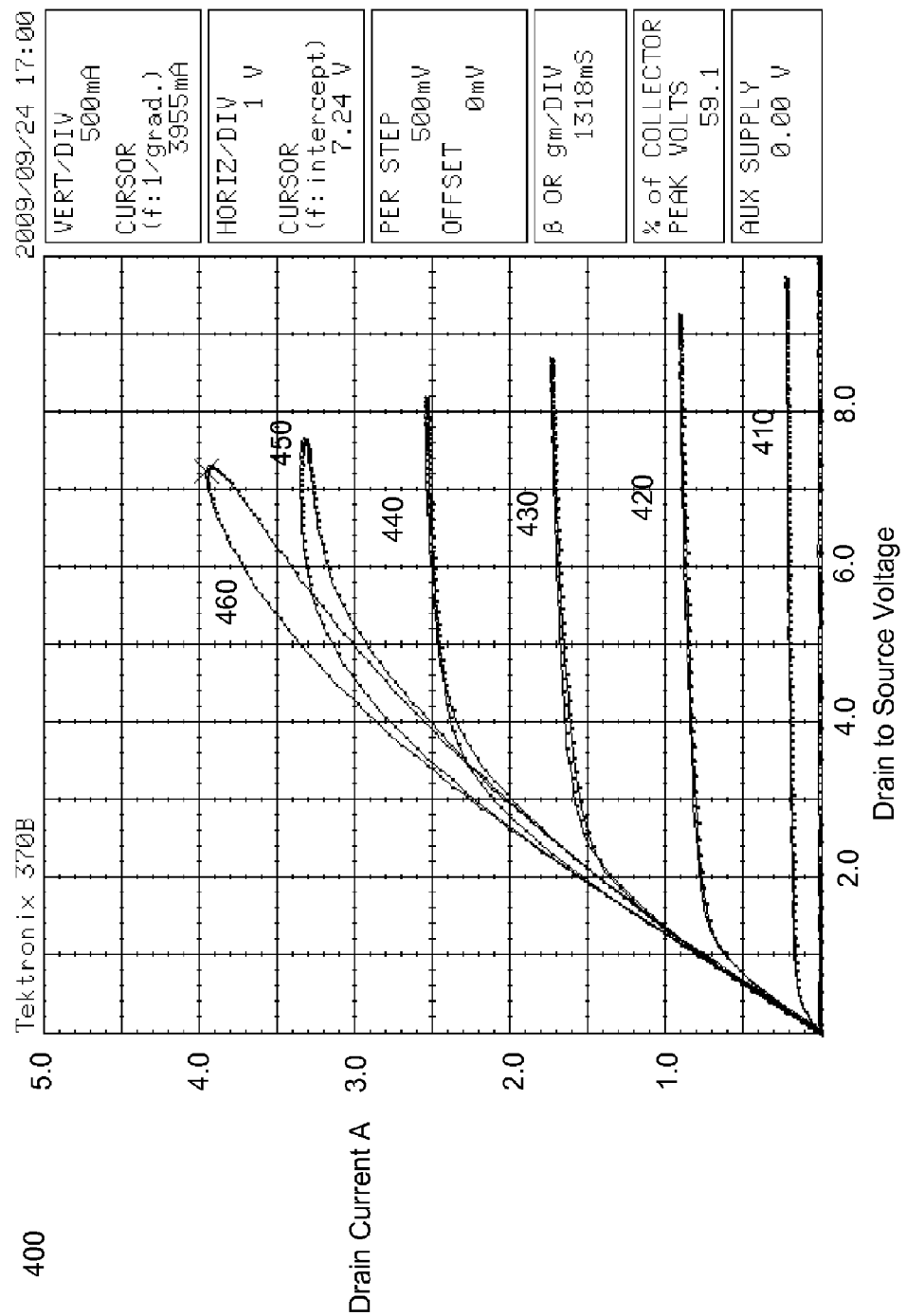
FIG. 4: Transistor characteristics of a 20 mm gate width III-Nitride heterojunction transistor on conductive substrate. HFET fabricated on a silicon substrate. The transistor has a maximum current of about 3.9 A and an on-resistance of less than 1.5 ohms.
Figure 5:
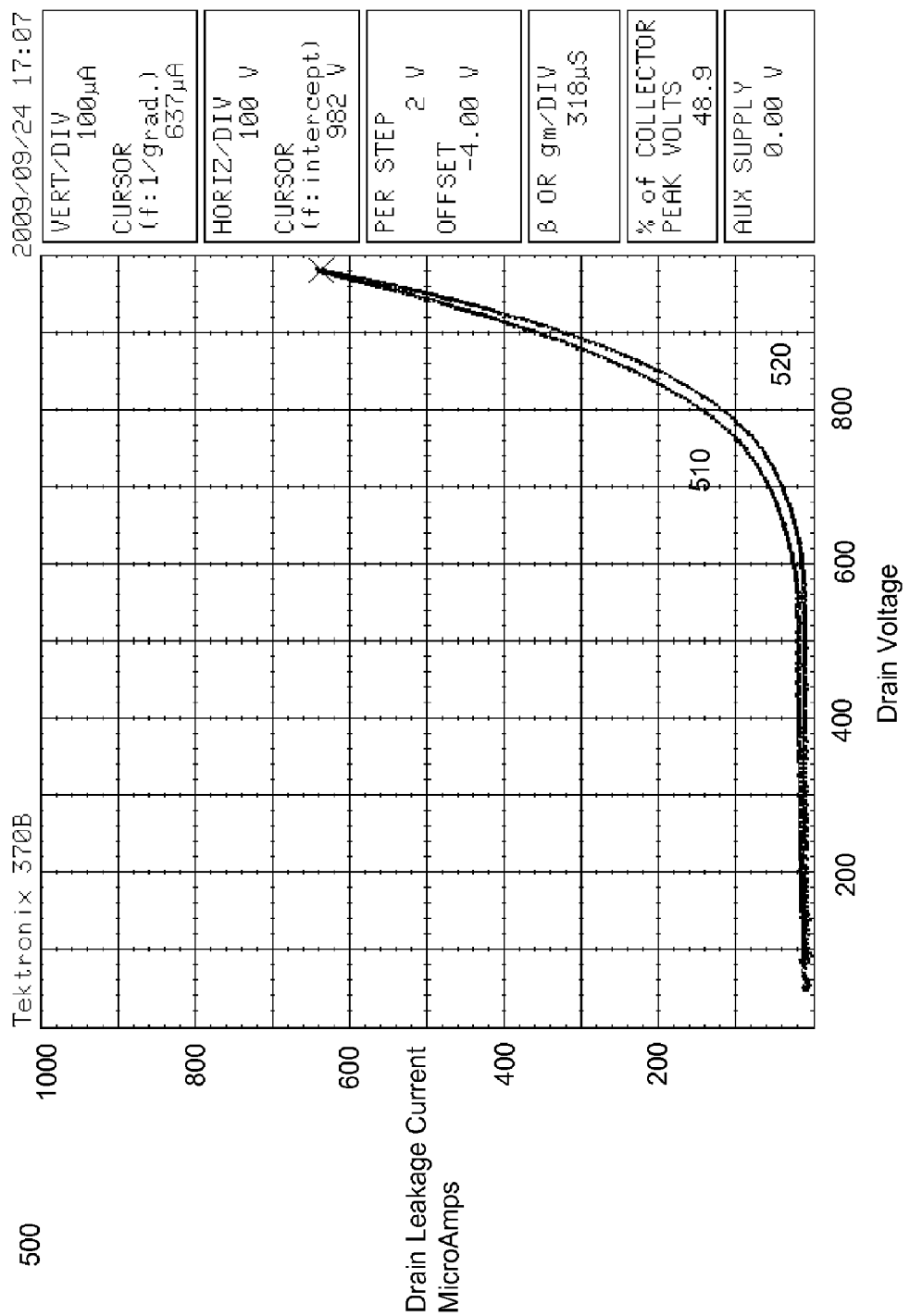
FIG. 5: Leakage current versus Drain voltage for a 20 mm gate width III-Nitride HFET fabricated on a silicon substrate. The transistor has a leakage current of less than 0.5 mA at drain voltage of 900V. The substrate of the HFET was connected to the package and HFET source connection.

A large HFET with 20 mm gate width was fabricated on a silicon substrate to confirm the desirable switching properties. The device was packaged in standard TO257 power switch packages. Die attachment in the package connected the silicon substrate to the package body. The package source pin was connected to the package body. For the common source measurements, both the source and substrate were connected to ground. FIG. 4 shows the curve tracer transistor characteristics of the 20 mm gate width HFET fabricated on a silicon substrate (as in FIG. 1). The HFET has a maximum drain current of at least 3.9 A and an on-resistance less than 1.5 ohms. For this, the gate to source was biased at 0, 0.5, 1.0, 1.5, 2.0 and 2.5 volts (curves 410, 420, 430, 440, 450 and 460 respectively). The drain current versus drain to source voltage was traced with the drain to source voltage increasing (e.g. upper curve of trace 460) and with the drain to source voltage decreasing (e.g. lower curve of trace 460). FIG. 5 shows the same HFET's drain leakage current of versus drain voltage but with the gate to source voltage set to −2 volts. The HFET shows a breakdown voltage (through the buffer) of about 900 V at a drain leakage current of 0.5 mA (25 microA/mm of gate width). This breakdown is much less than expected from surface breakdown. The package HFET breakdown voltage is close to the HFET breakdown voltage measured on-wafer with the substrate grounded, as expected. The curve tracer repeatedly broke down the HFET with no harm to the HFET. After breakdown testing, there was no observed change in the HFET transistor characteristics.

The technique described above was practiced with GaN materials. This is not to imply a limitation. The technique and method above may be practiced with other Group III materials and Group V materials. Typical Group III materials include Gallium and Indium. Group V materials include Nitrogen, Phosphorus, Arsenic, and Antimony.

Suitable substrate materials include by way of example and not limitation silicon and doped silicon, both non-conducting and conducting. Alternative substrate materials include conductive and high resistance GaAs, and conductive SiC.

Figure 7:
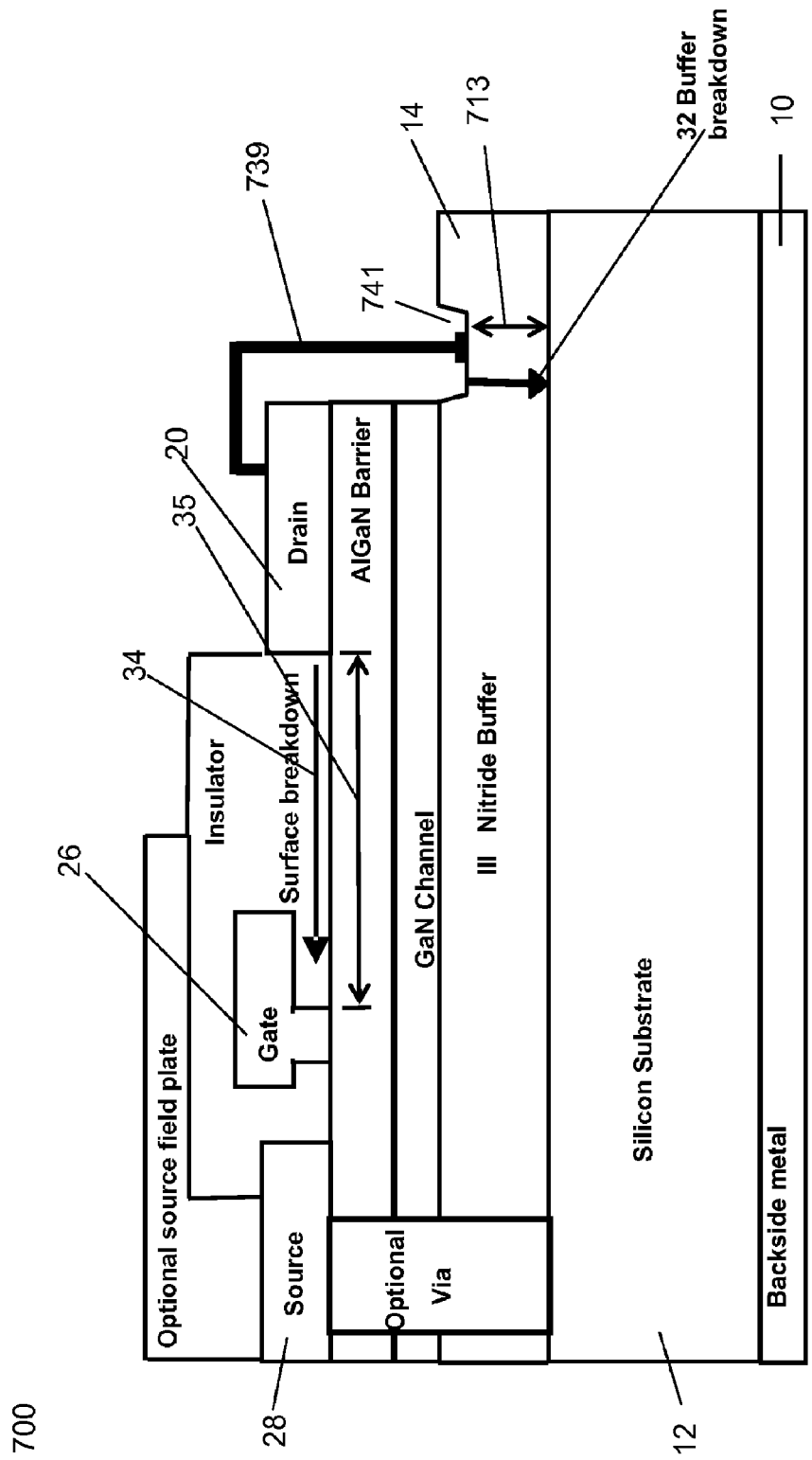
FIG. 7. III-Nitride heterojunction transistor on conductive substrate with recessed breakdown region.

In an alternate embodiment, the embodiment of FIG. 6 may be modified to include a recess in the buffer layer 14 as shown in FIG. 7. In this embodiment 700, the recess 741 may be etched to provide a breakdown path 32 that protects the breakdown path 34 between the drain and the gate. In this embodiment the buffer thickness is 713 and is shortest distance between the upper surface of the buffer layer and the substrate 12. The recess 741 may be partially filled with metal and electrically connected 739 to the drain although other connections are possible. In general, the recess 741 is electrically connected to the highest electrical potential in the device 700. The same materials and design features described for FIGS. 1 and 6 apply to embodiment 700 in FIG. 7. The capacitance between the electrical connection 739 and the substrate 12 may be controlled by minimizing the etch area for recess 741 and minimizing the area of metal in the recess 741.

The technique describe above may be practiced with other lateral devices which have a high resistance buffer between the high voltage terminal and the substrate. The technique may be practiced on layers grown by homo-epitaxy or hetero-epitaxy. The homo-epitaxy can be practiced with GaN grown on conductive GaN substrates, SiC grown on SiC conductive substrates, and GaAs grown on GaAs conductive substrates. The hetero-epitaxy can be practiced with SiC on silicon substrates and GaAs on silicon substrates. The substrate and any interfacial nucleation layer must be able to conduct the breakdown current such that the resistive voltage drop is small compared to the breakdown voltage or predictable. A highly conductive substrate is undesirable for fast switching device because the conductive substrate increase the capacitance from the high voltage terminal to ground.

The buffer breakdown electric field will be similar to the critical breakdown field for a given type buffer material and can be used for choosing initial estimates of required buffer thickness. For example known critical breakdown fields for buffer materials are: GaN 45 Volts/micrometer, 4H SiC 220 Volts/micrometer, and GaN 200 Volts/micrometer. The surface breakdown field can be estimated using physical device simulation using material properties. Physical simulation may be use for an initial estimate of the gate to drain spacing Lgd 35 required for BVs 34 greater than BVb 32 in FIG. 6. Since the accuracy of the physical simulator is limited by parameters not necessarily well known such as density of surface state traps, it may be necessary to experimentally verify dimensions or allow for the uncertainties in the simulation.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

I claim:

1. A method of fabricating an overvoltage tolerant HFET device, the method comprising:
   receiving an HFET device comprising a barrier layer disposed on a channel layer, the channel layer disposed on a buffer layer, the buffer layer disposed on a substrate;
   the HFET device having a surface breakdown field strength Es and a buffer breakdown field strength Ebar;
   wherein the buffer layer has a first thickness;
   disposing a source structure and a gate structure on the barrier layer;
   disposing a drain structure on the barrier layer a first distance from the gate structure;
   wherein the first distance multiplied by Es is greater than the first thickness multiplied by Ebar.

2. The method of claim 1 wherein the barrier layer substantially comprises AlGaN;
   the channel layer substantially comprises GaN; and
   the buffer layer substantially comprises GaN.

3. The method of claim 1 wherein the substrate substantially comprises silicon.

4. The method of claim 3 further comprising connecting the substrate to a ground.

5. The method of claim 1 wherein the substrate is disposed on a metal layer.

6. The method of claim 1 wherein Ebar is between 200 and 350 V/micrometer.

7. The method of claim 1 wherein the first distance is between 1.0 micrometers and 20 micrometers and the first thickness is between 1.0 micrometer and 8.0 micrometers.

8. The method of claim 1 further comprising:
   exposing a portion of the buffer layer beyond a boundary of the source, drain and gate;
   thinning the exposed buffer layer to a second thickness less than the first thickness;
   metalizing the thinned region of the buffer layer; and
   electrically connecting the thinned region of the buffer layer to the drain.

9. The method of claim 8 wherein the thinning of the buffer layer is accomplished by etching.

10. A HFET device comprising:
    source, drain and gate contacts disposed on a AlGaN barrier layer, the AlGaN barrier layer disposed on an GaN channel layer, the GaN channel layer disposed on a substantially GaN buffer layer with a breakdown field strength Ebar and the substantially GaN buffer layer disposed on a conductive substrate;
    the gate and drain contacts separated by a first distance and with a surface breakdown field strength Es;
    the source contact electrically connected to the conductive substrate;
    the substantially GaN buffer layer with a first thickness beneath the drain contact; and
    the first distance multiplied by Es is greater than the first thickness of the substantially GaN buffer layer multiplied by Ebar.

11. The HFET of claim 10 wherein the conductive substrate is disposed on a metal layer.

12. The HFET of claim 10 wherein the conductive substrate comprises silicon.

13. The HFET of claim 10 wherein the conductive substrate is electrically connected to the source contact with a conductive via.

* * * * *